United States Patent
Ho et al.

(10) Patent No.: US 7,872,325 B2
(45) Date of Patent: Jan. 18, 2011

(54) REDUCED-CROSSTALK WIREBONDING IN AN OPTICAL COMMUNICATION SYSTEM

(75) Inventors: Peter Ho, Union City, CA (US); Michael A. Robinson, Fremont, CA (US); Zuowei Shen, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 25 days.

(21) Appl. No.: 12/391,682

(22) Filed: Feb. 24, 2009

(65) Prior Publication Data
US 2010/0213566 A1    Aug. 26, 2010

(51) Int. Cl.
*H01L 31/075* (2006.01)
*H01L 31/105* (2006.01)
*H01L 31/117* (2006.01)

(52) U.S. Cl. .................. 257/458; 257/784; 257/786; 438/208; 438/912

(58) Field of Classification Search ............. 257/458, 257/784, 786
See application file for complete search history.

(56) References Cited

U.S. PATENT DOCUMENTS

| | | | |
|---|---|---|---|
| 5,004,317 A | 4/1991 | Jackson et al. | |
| 5,459,284 A | 10/1995 | Bockelman et al. | |
| 5,883,812 A | 3/1999 | Fujii | |
| 6,992,377 B2 * | 1/2006 | Zhou et al. | 257/692 |
| 2002/0089069 A1 | 7/2002 | Lamson et al. | |
| 2008/0227284 A1 | 9/2008 | Rebelo et al. | |
| 2009/0189059 A1 * | 7/2009 | Smith | 250/214 LA |

* cited by examiner

*Primary Examiner*—Phuc T Dang

(57) ABSTRACT

Wirebonds are formed to couple an opto-electronic device chip having two or more opto-electronic devices to a signal processing chip. Two or more mutually adjacent wirebond groups, each corresponding to one of the opto-electronic devices, are formed. For example, each wirebond group can include a first wirebond coupling a P-terminal of the opto-electronic device of the wirebond group to the signal processing chip, a second wirebond coupling an N-terminal of the opto-electronic device of the wirebond group to the signal processing chip, and a third wirebond coupling the opto-electronic device chip to the signal processing chip.

17 Claims, 6 Drawing Sheets

REDUCED-CROSSTALK WIREBONDING IN AN OPTICAL COMMUNICATION SYSTEM

BACKGROUND

In digital communications circuitry, higher data rates require faster signal edge transitions, i.e., rise and fall times, and shorter bit periods. The potential for undesirable crosstalk between adjacent channels increases with increased edge speed, and shorter bit periods reduce tolerance to the adverse effects of crosstalk. Under such conditions, minimizing crosstalk is important to ensuring proper data reception.

Optical fiber-based communication systems commonly include a receiver device that has one or more photodiodes or other opto-electronic detectors. The receiver device converts received optical signals into electrical signals. The outputs of the receiver device, e.g., a first integrated circuit chip, are connected to the inputs of another device, e.g., a second chip, which processes the received electrical signals.

As illustrated in FIGS. 1 and 2, for example, an opto-electronic receiver chip 10 and a processing chip 12 may be integrated within a multi-chip module 14. A plurality of optical fibers 16, 18, 20, etc. (with additional fibers and other elements that are not shown for purposes of clarity being indicated by an ellipsis (" . . . ") symbol) are coupled to module 14 via optical fiber connectors 22, 24, 26, etc. Opto-electronic receiver chip 10 includes a corresponding plurality of opto-electronic detectors (e.g., photodiodes) 28, 30, 32, etc. The optical signal, i.e., light, emanating from the end of each fiber 16, 18, 20, etc., is received by a corresponding detector 28, 30, 32, etc., which, in response, outputs an electrical signal representative of the received optical signal.

As described in further detail below, opto-electronic receiver chip 10 and a processing chip 12 can be electrically coupled to one another by wirebonds. As well understood in the art, wirebonding is a solid-phase welding process by which a very fine gauge uninsulated wire is welded to the metallic material of a corresponding wire bond pad on a chip, leadframe or other structure. A wire and bond pad are placed in contact with each other and welded together using heat, pressure or some combination thereof, typically through thermocompressive, ultrasonic or thermosonic processes. The term "wirebond" refers to both the welding process and the resulting connection formed in this manner.

A first group of two wirebonds 34 and 36 couples opto-electronic detector 28 to processing chip 12; a second group of two wirebonds 38 and 40 couples opto-electronic detector 30 to processing chip 12; an Nth group of two wirebonds 42 and 44 couples opto-electronic detector 32 to processing chip 12; etc. For purposes of convenience of description herein, each such group is described as corresponding to an optical "channel." The system can have any number (N) of such channels.

The N-terminal of, for example, opto-electronic detector 28 is coupled via wirebond 34 to a positive power supply voltage (V_SUPPLY) provided by power supply circuitry. The power supply circuitry can include filter circuitry, represented by the combination of a resistor 46 coupled to V_SUPPLY and a capacitor 48 coupled to ground. Likewise, the N-terminal of opto-electronic detector 30 is coupled via wirebond 38 to power supply circuitry represented by a similar combination of a resistor 50 and a capacitor 52, the N-terminal of opto-electronic detector 32 is coupled via wirebond 42 to power supply circuitry represented by a similar combination of a resistor 54 and a capacitor 56, etc. The P-terminal of opto-electronic detector 28 is coupled via wirebond 36 to the input of an amplifier 58; the P-terminal of opto-electronic detector 30 is coupled via wirebond 40 to the input of an amplifier 60; the P-terminal of opto-electronic detector 32 is coupled via wirebond 44 to the input of an amplifier 62; etc. In FIGS. 1 and 2, the N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively. Although not shown for purposes of clarity, the outputs of amplifiers 58, 60, 62, etc., are coupled to other circuitry in processing chip 12 involved in the processing of the received signal, as is well understood in the art.

In operation, each of opto-electronic detectors 28, 30, 32, etc., generates an electric current signal in response to the optical signal it receives. The above-described power supply circuitry supplies the N-terminal of each of opto-electronic detectors 28, 30, 32, etc., with a voltage. Due to the filtering or damping effect of the above-described resistances and capacitances, this voltage is relatively constant. The current, however, changes in response to the optical signal. Each of amplifiers 58, 60, 62, etc., generates an output signal in response to the current.

A changing voltage in a group of one or more of the above-described wirebonds can give rise to capacitively coupled crosstalk in an adjacent group of one or more wirebonds. Similarly, magnetic flux generated by a changing current in a group of wirebonds can give rise to inductively coupled crosstalk in an adjacent group of wirebonds. It is desirable to minimize such crosstalk.

SUMMARY

Embodiments of the present invention relate to forming reduced-crosstalk wirebonds to couple an opto-electronic device chip, which can comprise an opto-electronic receiver chip or opto-electronic transmitter chip, to a signal processing chip. The opto-electronic device chip has a plurality of opto-electronic devices, such as opto-electronic detectors or opto-electronic transmitters, each having an N-terminal and a P-terminal. For example, an opto-electronic detector can be a PIN (P-type, Intrinsic, N-type) diode or other photodiode. A plurality of wirebond groups is formed. Each wirebond group corresponds to one of the opto-electronic devices. Each wirebond group is adjacent to another wirebond group. Each wirebond group can comprise, for example, three wirebonds: a first wirebond coupling a P-terminal of the opto-electronic device of the wirebond group to the signal processing chip; a second wirebond coupling an N-terminal of the opto-electronic device of the wirebond group to the signal processing chip; and a third wirebond coupling the opto-electronic device chip to the signal processing chip. In various embodiments, either the second wirebond, the third wirebond, or both in combination can be arranged with respect to the first wirebond of the group to impede inductive or capacitive coupling between the first wirebond of the group and wirebonds of adjacent groups.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
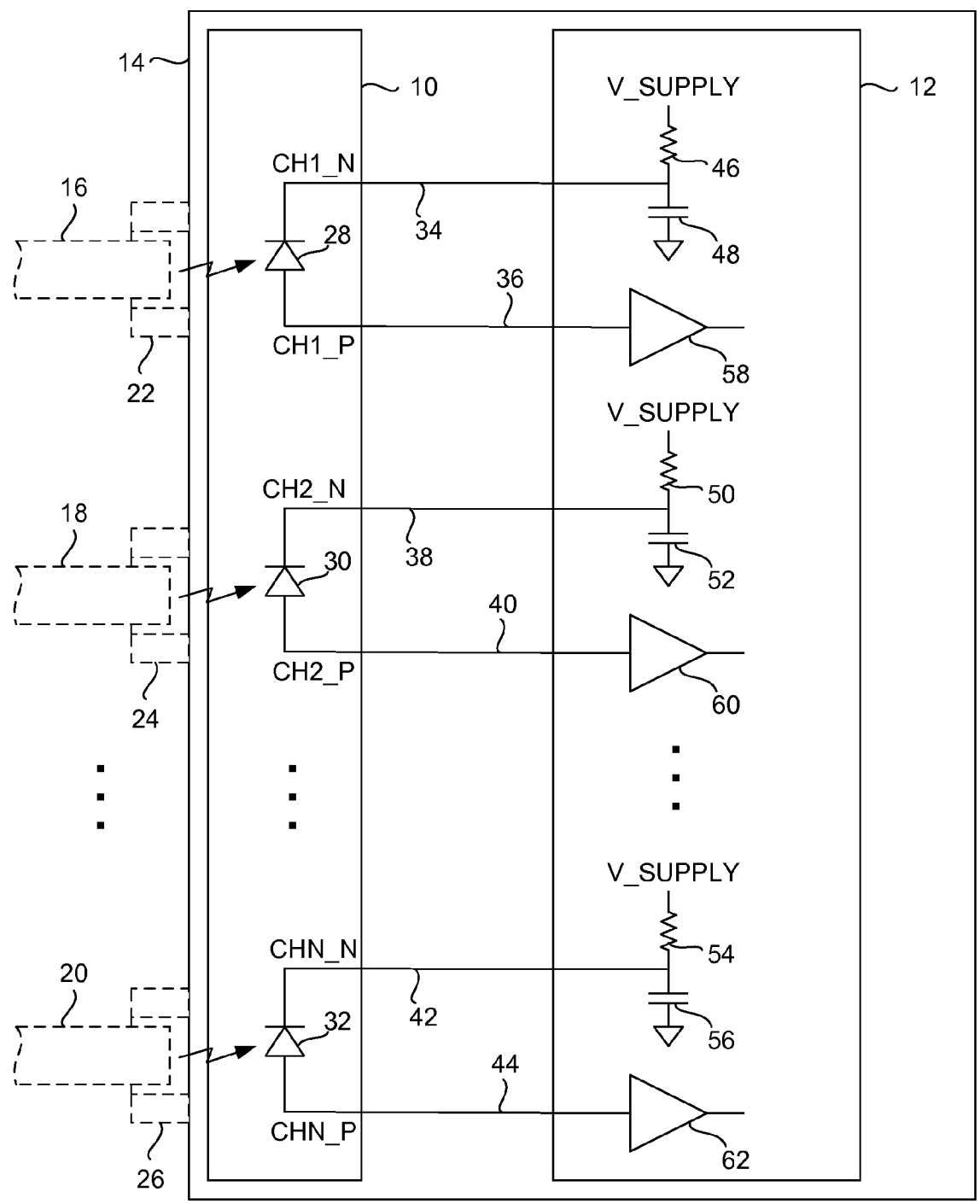
FIG. 1 is a schematic diagram illustrating a portion of an opto-electronic receiver chip and a portion of a processing chip connected to each other by wirebonds, as known in the prior art.
Figure 2:
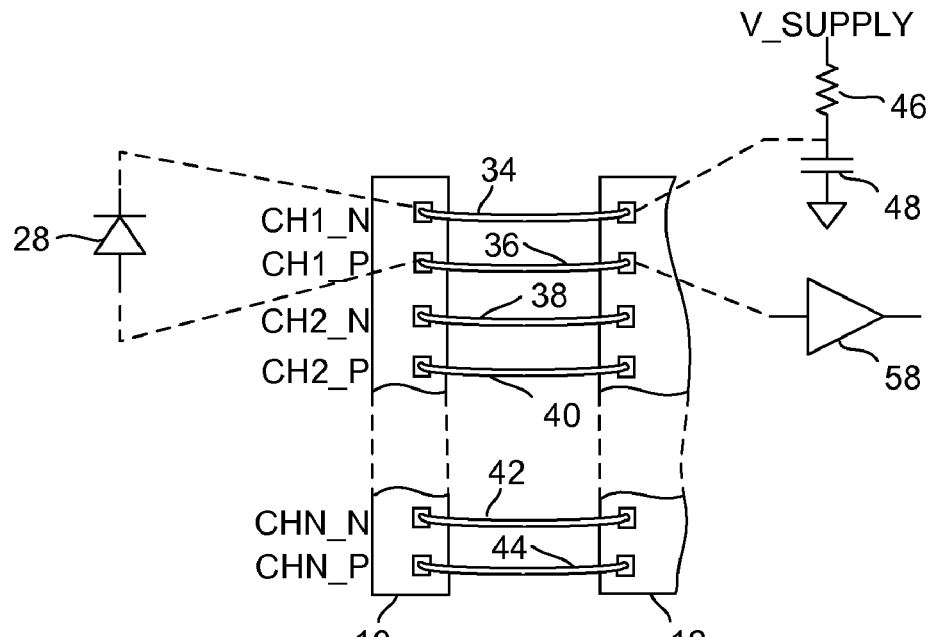
FIG. 2 is a plan view of the wirebond-interconnected portions of the opto-electronic receiver chip and processing chip of FIG. 1, with electronic elements thereof shown in broken line.
Figure 3:
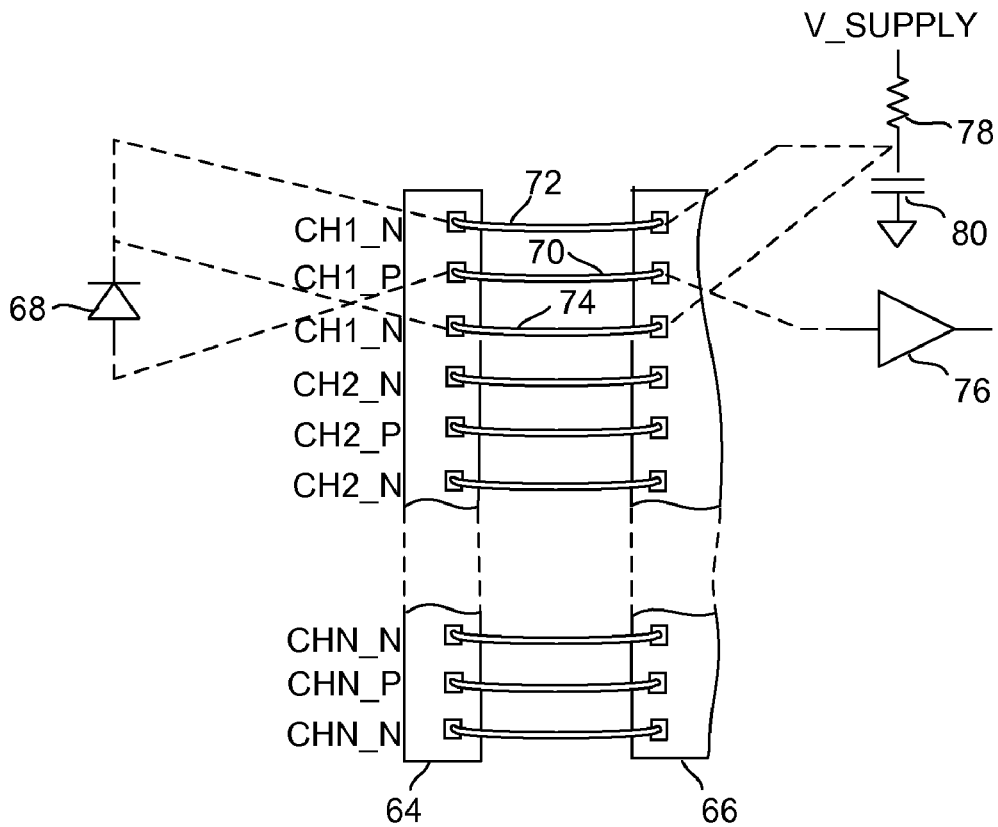
FIG. 3 is a plan view of wirebond-interconnected portions of a opto-electronic receiver chip and a processing chip, with electronic elements thereof shown in broken line, in accordance with a first exemplary embodiment of the invention.

As illustrated in FIG. 3, in an exemplary embodiment of the invention, an opto-electronic receiver chip 64 and a processing chip 66 are integrated within a multi-chip module (not shown in FIG. 3 for purposes of clarity). Receiver chip 64 has a plurality of opto-electronic detectors (only one of which is shown in FIG. 3 for purposes of clarity), such as PIN (P-type, Intrinsic, N-type) diodes or other photodiodes, each of which can be coupled to a corresponding optical fiber in the manner described above with regard to FIG. 1. Each of the opto-electronic detectors defines an optical channel through which optical signals can be received from the corresponding fiber. One exemplary opto-electronic detector 68 of receiver chip 64 is shown in broken line for purposes of illustration and its function is described below, but the others that are not shown function in a similar manner. Opto-electronic detector 68 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 70, a second wirebond 72, and a third wirebond 74 define a first wirebond group corresponding to a first channel. It should be noted that the wirebonds described in this patent specification ("herein") are all of a conventional type, in which heat, pressure, or some combination thereof are used to weld the ends of a very fine-gauge uninsulated wire. First wirebond 70 couples the P-terminal of opto-electronic detector 68 of to signal processing chip 66. Second wirebond 72 couples the N-terminal of opto-electronic detector 68 to signal processing chip 66. Third wirebond 74 similarly couples the N-terminal of opto-electronic detector 68 to the signal processing chip 66. In this exemplary embodiment, first, second and third wirebonds 70, 72 and 74 are disposed parallel to one another in a linear array. First wirebond 70 is disposed between second wirebond 72 and third wirebond 74 along the array. That is, one of second and third wirebonds 72 and 74 is disposed on one side of first wirebond 70, and the other is disposed on the other (or opposing) side of first wirebond 70.

In the embodiment illustrated in FIG. 3, first wirebond 70 couples the P-terminal of opto-electronic detector 68 to an amplifier 76 of signal processing chip 66, and each of second and third wirebonds 72 and 74 couples the N-terminal of opto-electronic detector 68 to a filtered power supply circuit of signal processing chip 66. The filtered power supply circuit is represented in FIG. 3 by a resistor 78 coupled to a supply voltage and a capacitor 80 coupled to ground, but in other embodiments the filtered power supply circuit can have any other suitable structure.

The second through Nth wirebond groups (with additional wirebond groups and other elements not shown for purposes of clarity being indicated by an ellipsis (" . . . ") symbol) are arranged in the same manner described above with regard to the first wirebond group. Therefore, these other wirebond groups are not described in similar detail to the first wirebond group. Note that although in this exemplary embodiment each wirebond group is adjacent another wirebond group, with the wirebonds of the groups collectively arranged in a linear array following the edges of chips 64 and 66, in other embodiments the groups and the wirebonds they comprise can be arranged in any other suitable manner, such as in a curving or arcuate array. It should also be noted that the term "adjacent" as used herein is intended only to describe the relative location of one wirebond group with respect to another, and is not intended to describe the location of a wirebond group or groups with respect to any other structure that may exist. For example, it is contemplated that there can be other structures, such as one or more additional wirebonds, between two adjacent wirebond groups.

In operation, opto-electronic detector 68 and each of the other opto-electronic detectors outputs an electrical signal representative of the optical signal it receives. The above-described filtered power supply supplies the N-terminal of opto-electronic detector 68 with a voltage. Due to the filtering or damping effect, this voltage is relatively constant. The current, however, changes in response to the optical signal. Amplifier 76 generates an output signal in response to the current. The other opto-electronic detectors that are not shown operate in the same manner and are therefore not described in similar detail herein.

Importantly, an effect of enclosing first wirebond 70 between second and third wirebonds 72 and 74 on opposing sides, respectively, of first wirebond 70 is to impede capacitive and inductive coupling (and thus crosstalk) between first wirebond 70 and wirebonds of the adjacent wirebond group, i.e., the second wirebond group. Note that first wirebond 70 is more sensitive to crosstalk than second and third wirebonds 72 and 74 because first wirebond 70 is coupled to an input of amplifier 76, whereas second and third wirebonds 72 and 74 are coupled to a filtered power supply output that provides a relatively constant voltage, i.e., no high-frequency voltage fluctuations of the type that can cause crosstalk. The same arrangement among the first, second and third wirebonds of the second wirebond group similarly impedes capacitive and inductive coupling between the first wirebond of the second group and wirebonds of adjacent groups. The same is true of each of the third through Nth wirebond groups.

Figure 4:
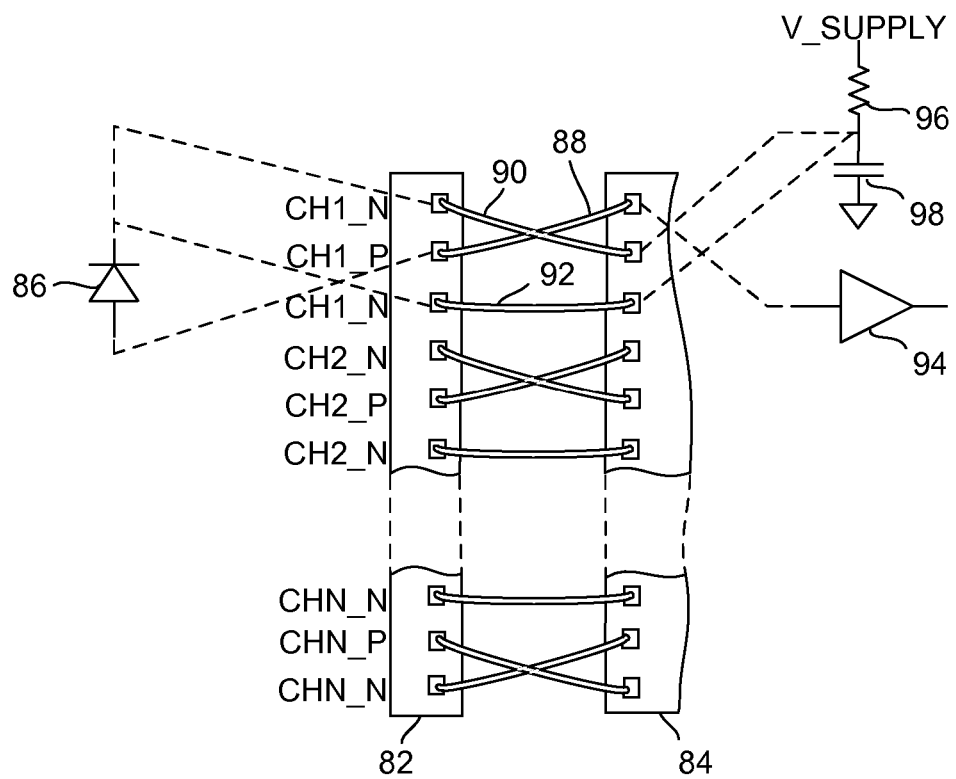
FIG. 4 is similar to FIG. 3, in accordance with a second exemplary embodiment of the invention.

As illustrated in FIG. 4, in another exemplary embodiment of the invention, an opto-electronic receiver chip 82 and a processing chip 84 are integrated within a multi-chip module (not shown for purposes of clarity). Opto-electronic receiver chip 82 has a plurality of opto-electronic detectors (only one of which is shown in FIG. 4 for purposes of clarity), such as positive-intrinsic-negative (PIN) diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 86 of opto-electronic receiver chip 82 is shown in broken line for purposes of illustration, and its function is described below, but the others that are not shown function in a similar manner. Opto-electronic detector 86 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 88, a second wirebond 90, and a third wirebond 92 define a first wirebond group corresponding to the first channel. First wirebond 88 couples the P-terminal of opto-electronic detector 86 to signal processing chip 84. Second wirebond 90 couples the N-terminal of opto-electronic detector 86 to signal processing chip 84. Third wirebond 92 similarly couples the N-terminal of opto-electronic detector 86 to signal processing chip 84. In this exemplary embodiment, first and second wirebonds 88 and 90 cross each other exactly once, in an "X"-shaped arrangement. Third wirebond 92 is disposed immediately adjacent to the crossed pair of wirebonds 88 and 90 but does not cross either of first or second wirebonds 88 and 90.

In this embodiment, first wirebond 88 couples the P-terminal of opto-electronic detector 86 to an amplifier 94 of signal processing chip 84, and second and third wirebonds 90 and 92 couple the N-terminal of opto-electronic detector 86 to a filtered power supply circuit of signal processing chip 84. The filtered power supply circuit is represented in FIG. 4 by a resistor 96 coupled to a supply voltage and a capacitor 98 coupled to ground, but in other embodiments the filtered power supply can have any other suitable structure.

The second through Nth wirebond groups are arranged in the same manner described above with regard to the first wirebond group. Therefore, these other wirebond groups are not described in similar detail to the first wirebond group. Note that although in this exemplary embodiment each wirebond group is adjacent another wirebond group, with the crossed wirebond pairs and other wirebonds of the groups collectively arranged in a linear array following the edges of chips 82 and 84, in other embodiments the groups and the wirebonds they comprise can be arranged in any other suitable manner, such as in a curving or arcuate array.

In operation, opto-electronic detector 86 and each of the other opto-electronic detectors outputs an electrical signal representative of the optical signal it receives. The above-described filtered power supply supplies the N-terminal of opto-electronic detector 86 with a supply voltage. Due to the filtering or damping effect, this voltage is relatively constant. The current, however, changes in response to the optical signal. Amplifier 94 generates an output signal in response to the current. The other opto-electronic detectors that are not shown operate in the same manner and are therefore not described in similar detail herein.

Importantly, an effect of crossing first and second wirebonds 88 and 90 and disposing third wirebond 92 between this crossed wirebond pair and the adjacent (i.e., second) wirebond group is to impede capacitive and inductive coupling (and thus crosstalk) between first wirebond 88 and wirebonds of the adjacent wirebond group. Note that first wirebond 88 is more sensitive to crosstalk than second and third wirebonds 90 and 92 because first wirebond 88 is coupled to an input of amplifier 94, whereas second and third wirebonds 90 and 92 are coupled to a filtered power supply output that provides a relatively constant voltage, i.e., no high-frequency voltage fluctuations of the type that can cause crosstalk. The same arrangement among the first, second and third wirebonds of the second wirebond group similarly impedes capacitive and inductive coupling between the first wirebond of the second group and wirebonds of adjacent groups. The same is true of each of the third through Nth wirebond groups.

Figure 5:
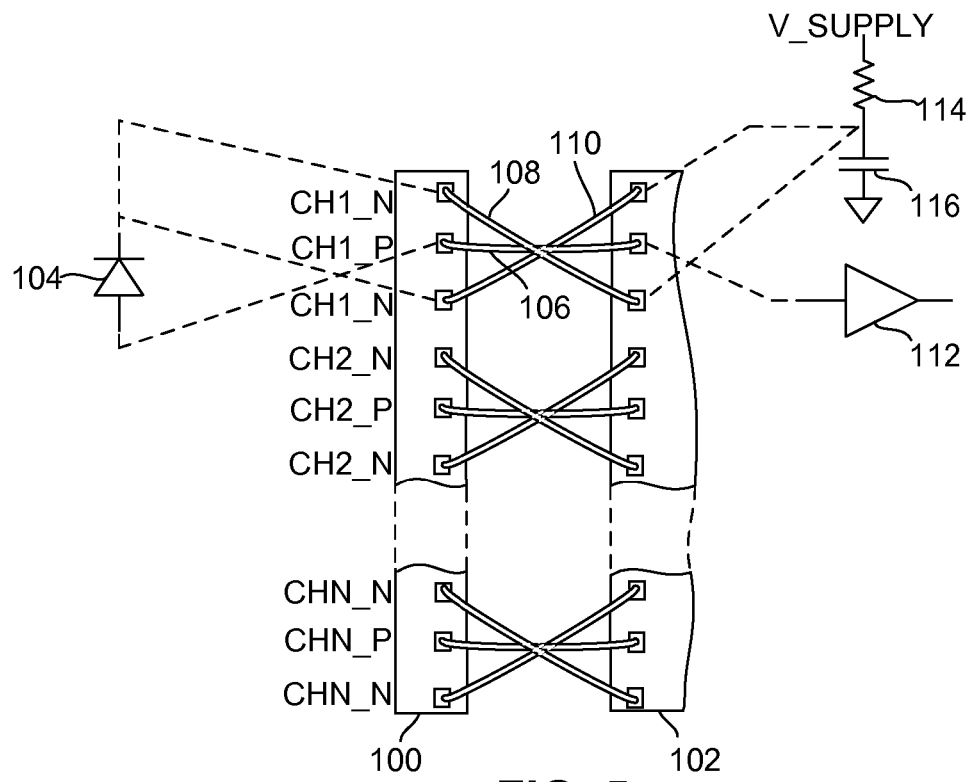
FIG. 5 is similar to FIGS. 3 and 4, in accordance with a third exemplary embodiment of the invention.

As illustrated in FIG. 5, in still another exemplary embodiment of the invention, an opto-electronic receiver chip 100 and a processing chip 102 are integrated within a multi-chip module (not shown for purposes of clarity). Opto-electronic receiver chip 100 has a plurality of opto-electronic detectors (only one of which is shown in FIG. 5 for purposes of clarity), such as PIN diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 104 of opto-electronic receiver chip 100 is shown in broken line for purposes of illustration, and its function is described below, but the others that are not shown function in a similar manner. Opto-electronic detector 104 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 106, a second wirebond 108, and a third wirebond 110 define a first wirebond group corresponding to the first channel. First wirebond 106 couples the P-terminal of opto-electronic detector 104 to signal processing chip 102. Second wirebond 108 couples the N-terminal of opto-electronic detector 104 to signal processing chip 102. Third wirebond 110 similarly couples the N-terminal of opto-electronic detector 104 to signal processing chip 102. In this exemplary embodiment, all three of first, second and third wirebonds 106, 108 and 110 cross each other in a star-shaped arrangement, though in other embodiments they can cross each other in other arrangements.

In this embodiment, first wirebond 106 couples the P-terminal of opto-electronic detector 104 to an amplifier 112 of signal processing chip 102, and second and third wirebonds 108 and 110 couple the N-terminal of opto-electronic detector 104 to a filtered power supply circuit of signal processing chip 102. The filtered power supply circuit is represented in FIG. 5 by a resistor 114 coupled to a supply voltage and a capacitor 116 coupled to ground, but in other embodiments the filtered power supply can have any other suitable structure.

The second through Nth wirebond groups are arranged in the same manner described above with regard to the first wirebond group. Therefore, these other wirebond groups are not described in similar detail to the first wirebond group. Note that although in this exemplary embodiment each wirebond group is adjacent another wirebond group, with the wirebond groups arranged in a linear array following the edges of chips 100 and 102, in other embodiments the wirebond groups can be arranged in any other suitable manner, such as in a curving or arcuate array.

In operation, opto-electronic detector 104 and each of the other opto-electronic detectors outputs an electrical signal representative of the optical signal it receives. The above-described filtered power supply supplies the N-terminal of opto-electronic detector 104 with a voltage. Due to the filtering or damping effect, this voltage is relatively constant. The current, however, changes in response to the optical signal. Amplifier 112 generates an output signal in response to the current. The other opto-electronic detectors that are not shown operate in the same manner and are therefore not described in similar detail herein.

Importantly, an effect of crossing first, second and third wirebonds 106, 108 and 110 is to impede capacitive and inductive coupling (and thus crosstalk) between first wirebond 106 and wirebonds of the adjacent wirebond group. Note that first wirebond 106 is more sensitive to crosstalk than second and third wirebonds 108 and 110 because first wirebond 106 is coupled to an input of amplifier 112, whereas second and third wirebonds 108 and 110 are coupled to a filtered power supply output that provides a relatively constant voltage, i.e., no high-frequency voltage fluctuations of the type that can cause crosstalk. The same arrangement among the first, second and third wirebonds of the second wirebond group similarly impedes capacitive and inductive coupling between the first wirebond of the second group and wirebonds of adjacent groups. The same is true of each of the third through Nth wirebond groups.

Figure 6:
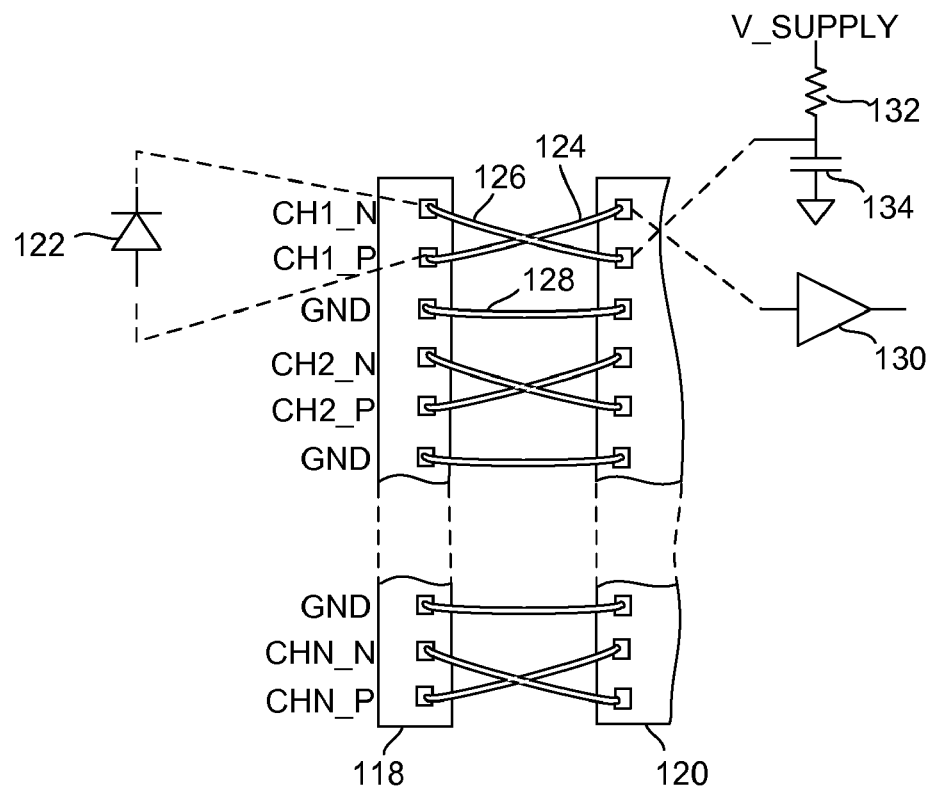
FIG. 6 is similar to FIGS. 3-5, in accordance with a fourth exemplary embodiment of the invention.

As illustrated in FIG. 6, in an embodiment of the invention similar to that described above with regard to FIG. 4, an opto-electronic receiver chip 118 and a processing chip 120 are integrated within a multi-chip module (not shown for purposes of clarity). Opto-electronic receiver chip 118 has a plurality of opto-electronic detectors (only one of which is shown in FIG. 6 for purposes of clarity), such as PIN diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 122 of opto-electronic receiver chip 118 is shown in broken line for purposes of illustration, and its function is described below, but the others that are not shown function in a similar manner. Opto-electronic detector 122 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 124, a second wirebond 126, and a third wirebond 128 define a first wirebond group corresponding to the first channel. First wirebond 124 couples the P-terminal of opto-electronic detector 122 to signal processing chip 120. Second wirebond 126 couples the N-terminal of opto-electronic detector 122 to signal processing chip 120. Third wirebond 128 couples a ground terminal of opto-electronic receiver chip 118 to a ground terminal of signal processing chip 120. In this exemplary embodiment, first and second wirebonds 124 and 126 cross each other exactly once, in an "X"-shaped arrangement. Third wirebond 128 is disposed immediately adjacent to the cross pair of wirebonds 124 and 126 but does not cross either of first or second wirebonds 124 and 126.

In this embodiment, first wirebond 124 couples the P-terminal of opto-electronic detector 122 to an amplifier 130 of signal processing chip 120, and second wirebond 126 couples the N-terminal of opto-electronic detector 122 to a filtered power supply circuit of signal processing chip 120. The filtered power supply circuit is represented in FIG. 6 by a resistor 132 coupled to a supply voltage and a capacitor 134 coupled to ground, but in other embodiments the filtered power supply circuit can have any other suitable structure.

The second through Nth wirebond groups are arranged in the same manner described above with regard to the first wirebond group. Therefore, these other wirebond groups are not described in similar detail to the first wirebond group. Note that although in this exemplary embodiment each wirebond group is adjacent another wirebond group, with the crossed wirebond pairs and other wirebonds of the groups collectively arranged in a linear array following the edges of chips 118 and 120, in other embodiments the groups and the wirebonds they comprise can be arranged in any other suitable manner, such as in a curving or arcuate array.

It should be noted that although in the embodiment illustrated in FIG. 6 third wirebond 128 couples a ground terminal of opto-electronic receiver chip 118 to a ground terminal of signal processing chip 120, in other embodiments one end of such a third wirebond can be attached to an element other than a ground terminal, such as a metalized ground region on or near the opto-electronic detector, processing chip, or other device. In still other embodiments, such a terminal or region to which such a third wirebond can be coupled can carry a signal other than ground, such as a supply voltage or bias voltage.

In operation, opto-electronic detector 122 and each of the other opto-electronic detectors outputs an electrical signal representative of the optical signal it receives. The above-described filtered power supply circuit supplies the N-terminal of opto-electronic detector 122 with a voltage. Due to the filtering or damping effect, this voltage is relatively constant. The current, however, changes in response to the optical signal. Amplifier 130 generates an output signal in response to the current. The other opto-electronic detectors that are not shown operate in the same manner and are therefore not described in similar detail herein.

Importantly, an effect of crossing first and second wirebonds 124 and 126 disposing third wirebond 128, which carries a ground signal, between this crossed wirebond pair and the adjacent (i.e., second) wirebond group is to impede capacitive and inductive coupling (and thus crosstalk) between first wirebond 124 and wirebonds of the adjacent wirebond group. Note that first wirebond 124 is more sensitive to crosstalk than second and third wirebonds 126 and 128 because first wirebond 124 is coupled to an input of amplifier 130, whereas second wirebond 126 is coupled to a filtered power supply output that provides a relatively constant voltage, and third wirebond 128 is coupled to ground. The same arrangement among the first, second and third wirebonds of the second wirebond group similarly impedes capacitive and inductive coupling between the first wirebond of the second group and wirebonds of adjacent groups. The same is true of each of the third through Nth wirebond groups.

Figure 7:
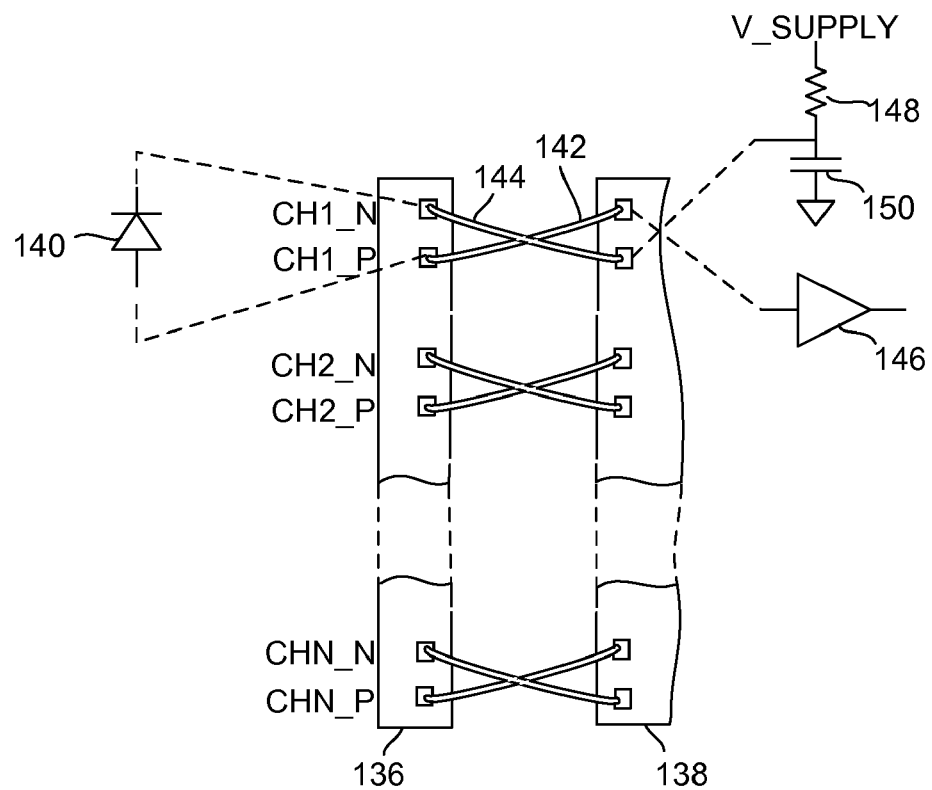
FIG. 7 is similar to FIGS. 4-6, in accordance with a fifth exemplary embodiment of the invention.

As illustrated in FIG. 7, in an embodiment of the invention similar to that described above with regard to FIGS. 4 and 6, an opto-electronic receiver chip 136 and a processing chip 138 are integrated within a multi-chip module (not shown for purposes of clarity). Opto-electronic receiver chip 136 has a plurality of opto-electronic detectors (only one of which is shown in FIG. 7 for purposes of clarity), such as PIN diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 140 of opto-electronic receiver chip 136 is shown in broken line for purposes of illustration, and its function is described below, but the others that are not shown function in a similar manner. Opto-electronic detector 140 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 142 and a second wirebond 144 define a first wirebond group corresponding to the first channel. First wirebond 142 couples the P-terminal of opto-electronic detector 140 to signal processing chip 138. Second wirebond 144 couples the N-terminal of opto-electronic detector 140 to signal processing chip 138. In this exemplary embodiment, first and second wirebonds 142 and 144 cross each other exactly once, in an "X"-shaped arrangement. Note that as first and second wirebonds 142 and 144 cross each other only once, they can be uninsulated, i.e., bare, wires in the manner of conventional wirebonds and yet avoid contacting each other.

In this embodiment, first wirebond 142 couples the P-terminal of opto-electronic detector 140 to an amplifier 146 of signal processing chip 138, and second wirebond 144 couples the N-terminal of opto-electronic detector 140 to a filtered power supply circuit of signal processing chip 138. The filtered power supply circuit is represented in FIG. 7 by a resistor 148 coupled to a supply voltage and a capacitor 150 coupled to ground, but in other embodiments the filtered power supply circuit can have any other suitable structure.

The second through Nth wirebond groups are arranged in the same manner described above with regard to the first wirebond group. Therefore, these other wirebond groups are not described in similar detail to the first wirebond group. Note that although in this exemplary embodiment each wirebond group is adjacent another wirebond group, with the crossed wirebond pairs and other wirebonds of the groups collectively arranged in a linear array following the edges of chips 136 and 138, in other embodiments the groups and the wirebonds they comprise can be arranged in any other suitable manner, such as in a curving or arcuate array.

In operation, opto-electronic detector 140 and each of the other opto-electronic detectors outputs an electrical signal representative of the optical signal it receives. The above-described filtered power supply circuit supplies the N-terminal of opto-electronic detector 140 with a voltage. Due to the filtering or damping effect, this voltage is relatively constant. The current, however, changes in response to the optical signal. Amplifier 146 generates an output signal in response to the current. The other opto-electronic detectors that are not shown operate in the same manner and are therefore not described in similar detail herein. As in other embodiments described above, an effect of crossing first and second wirebonds 142 and 144 is to impede capacitive and inductive coupling (and thus crosstalk) with wirebonds of the adjacent wirebond group.

Figure 8:
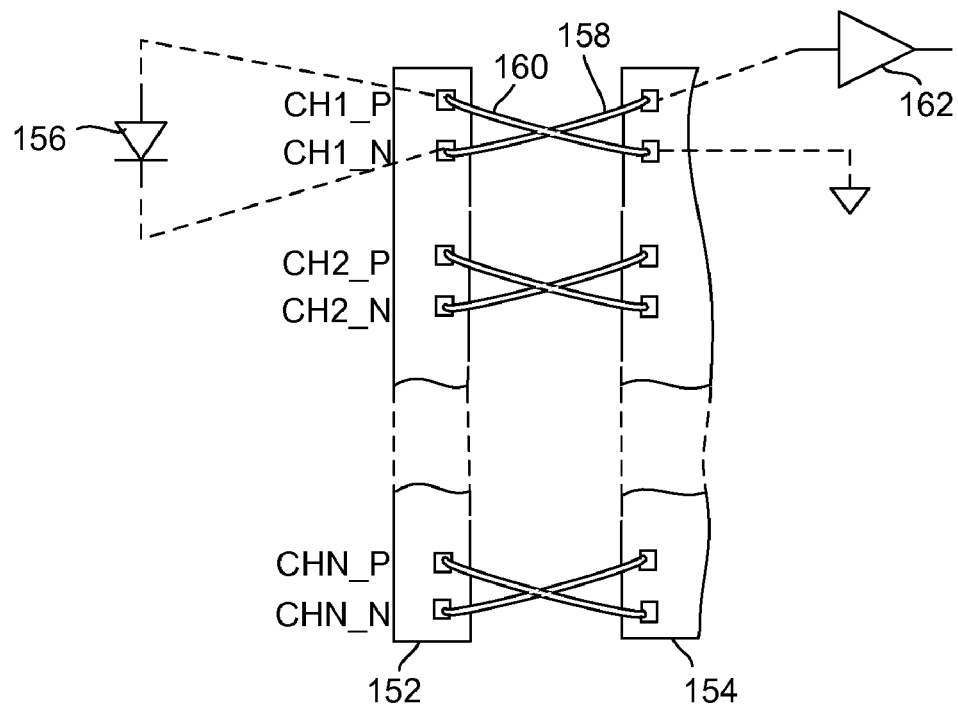
FIG. 8 is similar to FIG. 7, in accordance with a sixth exemplary embodiment of the invention.

In still other embodiments, the opto-electronic detector polarity can be the reverse of that described above, such that the N-terminal is coupled to the amplifier input. For example, as illustrated in FIG. 8, in an embodiment of the invention similar to that described above with regard to FIG. 7, an opto-electronic receiver chip 152 and a processing chip 154 are integrated within a multi-chip module (not shown for purposes of clarity). Opto-electronic receiver chip 152 has a plurality of opto-electronic detectors (only one of which is shown in FIG. 8 for purposes of clarity), such as PIN diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 156 of opto-electronic receiver chip 152 is shown in broken line for purposes of illustration, and its function is described below, but the others that are not shown function in a similar manner. Opto-electronic detector 156 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 158 and a second wirebond 160 define a first wirebond group corresponding to the first channel. First wirebond 158 couples the N-terminal of opto-electronic detector 156 to signal processing chip 154. Second wirebond 160 couples the P-terminal of opto-electronic detector 156 to signal processing chip 154. In this exemplary embodiment, first and second wirebonds 158 and 160 cross each other exactly once, in an "X"-shaped arrangement. Note that as first and second wirebonds 158 and 160 cross each other only once, they can be uninsulated, i.e., bare, wires in the manner of conventional wirebonds and yet avoid contacting each other.

In this embodiment, first wirebond 158 couples the N-terminal of opto-electronic detector 156 to an amplifier 162 of signal processing chip 154, and second wirebond 160 couples the P-terminal of opto-electronic detector 156 to ground potential or other fixed, predetermined potential, such as a bias voltage, associated with signal processing chip 154.

Figure 9:
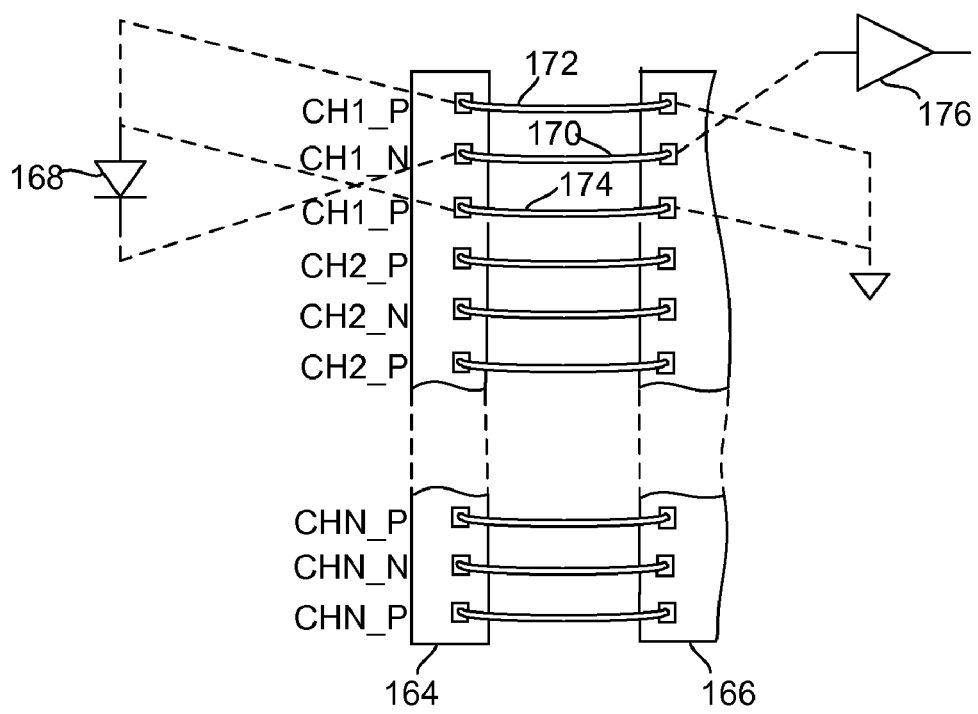
FIG. 9 is similar to FIG. 3, in accordance with a seventh exemplary embodiment of the invention.

As illustrated in FIG. 9, in an embodiment similar to that described above with regard to FIG. 3 but in which the opto-electronic detector N-terminal is coupled to the amplifier input, an opto-electronic receiver chip 164 and a processing chip 66 are integrated within a multi-chip module (not shown in FIG. 9 for purposes of clarity). Receiver chip 164 has a plurality of opto-electronic detectors (only one of which is shown in FIG. 9 for purposes of clarity), such as positive-intrinsic-negative (PIN) diodes or other photodiodes, each of which can be coupled to a corresponding optical fiber in the manner described above with regard to FIG. 1. Each of the opto-electronic detectors defines an optical channel through which optical signals can be received from the corresponding fiber. One exemplary opto-electronic detector 168 of receiver chip 164 is shown in broken line for purposes of illustration and its function is described below, but the others that are not shown function in a similar manner. Opto-electronic detector 168 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 170, a second wirebond 172, and a third wirebond 174 define a first wirebond group corresponding to a first channel. First wirebond 170 couples the N-terminal of opto-electronic detector 168 of to signal processing chip 166. Second wirebond 172 couples the P-terminal of opto-electronic detector 168 to signal processing chip 166. Third wirebond 174 similarly couples the P-terminal of opto-electronic detector 168 to the signal processing chip 166. In this exemplary embodiment, first, second and third wirebonds 170, 172 and 174 are disposed parallel to one another in a linear array. First wirebond 170 is disposed between second wirebond 172 and third wirebond 174 along the array. That is, one of second and third wirebonds 172 and 174 is disposed on one side of first wirebond 170, and the other is disposed on the other (or opposing) side of first wirebond 170.

In the embodiment illustrated in FIG. 9, first wirebond 170 couples the N-terminal of opto-electronic detector 168 to an amplifier 176 of signal processing chip 166, and each of second and third wirebonds 172 and 174 couples the P-terminal of opto-electronic detector 68 to ground potential or other fixed, predetermined potential, such as a bias voltage, associated with signal processing chip 166.

Figure 10:
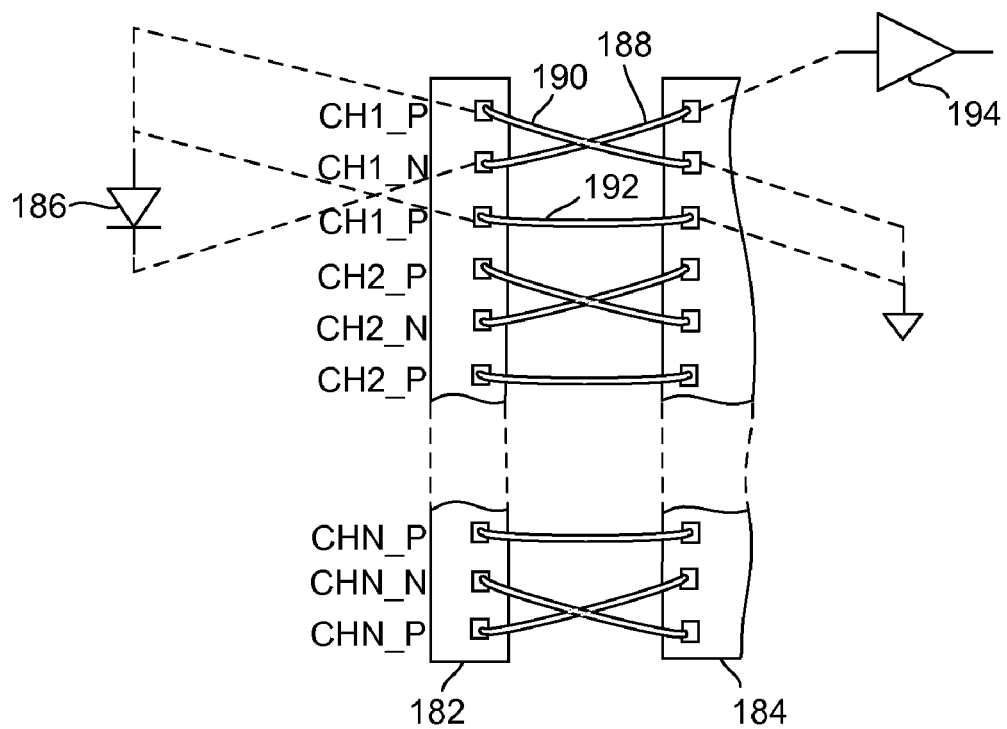
FIG. 10 is similar to FIG. 4, in accordance with a eighth exemplary embodiment of the invention.

As illustrated in FIG. 10, in an exemplary embodiment of the invention similar to that described above with regard to FIG. 4 but in which the opto-electronic detector N-terminal is coupled to the amplifier input, an opto-electronic receiver chip 182 and a processing chip 184 are integrated within a multi-chip module (not shown for purposes of clarity). Opto-electronic receiver chip 182 has a plurality of opto-electronic detectors (only one of which is shown in FIG. 10 for purposes of clarity), such as positive-intrinsic-negative (PIN) diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 186 of opto-electronic receiver chip 182 is shown in broken line for purposes of illustration, and its function is described below, but the others that are not shown function in a similar manner. Opto-electronic detector 186 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 188, a second wirebond 190, and a third wirebond 192 define a first wirebond group corresponding to the first channel. First wirebond 188 couples the N-terminal of opto-electronic detector 186 to signal processing chip 184. Second wirebond 190 couples the P-terminal of opto-electronic detector 186 to signal processing chip 184. Third wirebond 192 similarly couples the P-terminal of opto-electronic detector 186 to signal processing chip 184. In this exemplary embodiment, first and second wirebonds 188 and 190 cross each other exactly once, in an "X"-shaped arrangement. Third wirebond 192 is disposed immediately adjacent to the crossed pair of wirebonds 188 and 190 but does not cross either of first or second wirebonds 188 and 190.

In this embodiment, first wirebond 188 couples the N-terminal of opto-electronic detector 186 to an amplifier 194 of signal processing chip 184, and second and third wirebonds 190 and 192 couple the P-terminal of opto-electronic detector 86 to ground potential or other fixed, predetermined potential, such as a bias voltage, associated with signal processing chip 84.

Figure 11:
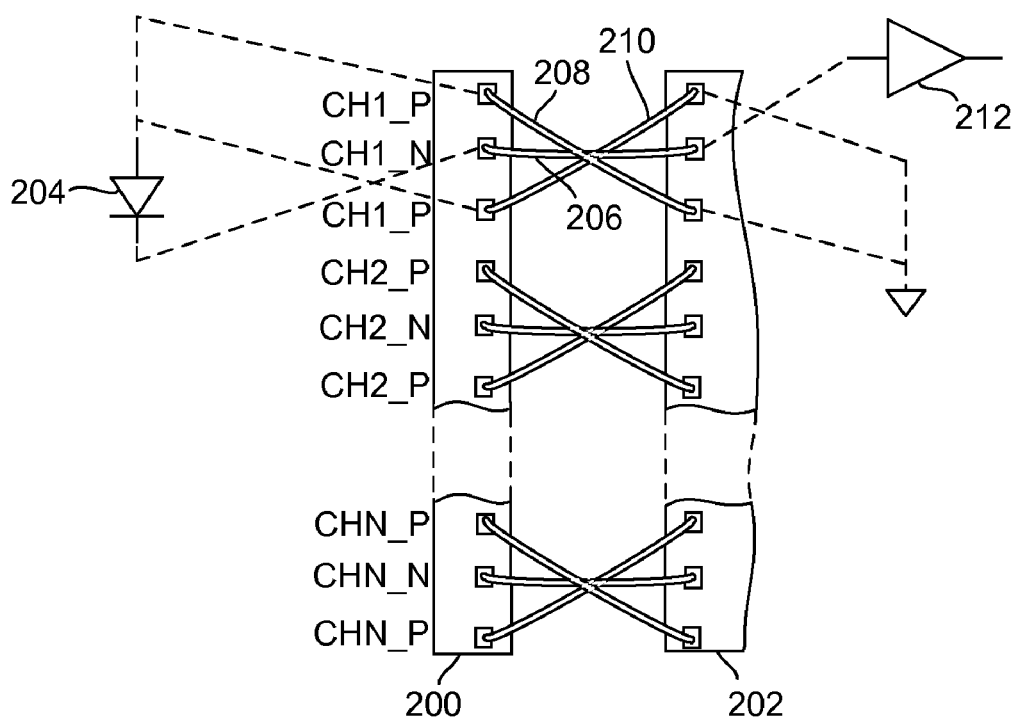
FIG. 11 is similar to FIG. 5, in accordance with a ninth exemplary embodiment of the invention.

As illustrated in FIG. 11, in an exemplary embodiment of the invention similar to that described above with regard to FIG. 5 but in which the opto-electronic detector N-terminal is coupled to the amplifier input, an opto-electronic receiver chip 200 and a processing chip 202 are integrated within a multi-chip module (not shown for purposes of clarity). Opto-electronic receiver chip 200 has a plurality of opto-electronic detectors (only one of which is shown in FIG. 11 for purposes of clarity), such as PIN diodes or other photodiodes, each of which can be coupled to a corresponding optical fiber as described above with regard to FIG. 1. Each of the opto-electronic detectors defines an optical channel through which optical signals can be received from the corresponding fiber. One exemplary opto-electronic detector 204 of opto-electronic receiver chip 200 is shown in broken line for purposes of illustration, and its function is described below, but the others that are not shown function in a similar manner. Opto-electronic detector 204 and each of the other opto-electronic detectors has an N-terminal and a P-terminal. The N-terminal signal path and P-terminal signal path of the optical channels (which can be designated channel "1" through channel "N" for purposes of convenience) are labeled "CH1_N" and "CH1_P", respectively, through "CHN_N" and "CHN_P", respectively.

A first wirebond 206, a second wirebond 208, and a third wirebond 210 define a first wirebond group corresponding to the first channel. First wirebond 206 couples the N-terminal of opto-electronic detector 204 to signal processing chip 202. Second wirebond 208 couples the P-terminal of opto-electronic detector 204 to signal processing chip 202. Third wirebond 210 similarly couples the P-terminal of opto-electronic detector 204 to signal processing chip 202. In this exemplary embodiment, all three of first, second and third wirebonds 206, 208 and 210 cross each other in a star-shaped arrangement, though in other embodiments they can cross each other in other arrangements.

In this embodiment, first wirebond 206 couples the N-terminal of opto-electronic detector 204 to an amplifier 212 of signal processing chip 202, and second and third wirebonds 208 and 210 couple the P-terminal of opto-electronic detector 204 to ground potential or other fixed, predetermined potential, such as a bias voltage, associated with signal processing chip 202.

The embodiments of the invention that have been described above are intended only as examples or illustrations. In view of the above, other embodiments within the scope of the invention will readily occur to persons skilled in the art. For example, although embodiments in which the opto-electronic devices are opto-electronic detectors such as photodiodes are described above, in still other embodiments the opto-electronic devices can be opto-electronic transmitters such as lasers. It is to be understood that the invention is defined by the appended claims and is not limited to the specific embodiments described.

What is claimed is:

1. A system for coupling an opto-electronic device chip having a plurality of opto-electronic devices to a signal processing chip, comprising:
 a plurality of wirebond groups, each wirebond group corresponding to one of the opto-electronic devices, each wirebond group comprising three wirebonds, each wirebond group being adjacent to another wirebond group of the plurality of wirebond groups;
 wherein each wirebond group comprises:
 a first wirebond coupling a P-terminal of the opto-electronic device of the wirebond group to the signal processing chip;
 a second wirebond crossing the first wirebond and coupling an N-terminal of the opto-electronic device of the wirebond group to the signal processing chip; and
 a third wirebond coupling the opto-electronic device chip to the signal processing chip, wherein the third wirebond does not cross either of the first and second wirebonds.

2. The system claimed in claim 1, wherein each opto-electronic device is an opto-electronic detector comprising a PIN diode.

3. The system claimed in claim 1, wherein the third wirebond couples an N-terminal of the opto-electronic device to the signal processing chip.

4. The system claimed in claim 1, wherein the third wirebond couples a fixed potential terminal of the opto-electronic device chip to the signal processing chip.

5. The system claimed in claim 1, wherein each opto-electronic device is an opto-electronic detector comprising a PIN diode.

6. The system claimed in claim 1, wherein each opto-electronic device is an opto-electronic detector, and the first wirebond couples an P-terminal of the opto-electronic detector to an amplifier of the signal processing chip.

7. The system claimed in claim 1, wherein the second and third wirebonds couple an N-terminal of the opto-electronic device to a filtered power supply of the signal processing chip.

8. The system claimed in claim 1, wherein:
   each opto-electronic device is an opto-electronic detector;
   the first wirebond couples an N-terminal of the opto-electronic detector to an amplifier of the signal processing chip; and
   the second and third wirebonds couple a P-terminal of the opto-electronic detector to a fixed potential.

9. A system for coupling an opto-electronic device chip having a plurality of opto-electronic devices to a signal processing chip, comprising:
   a plurality of wirebond groups, each wirebond group corresponding to one of the opto-electronic devices, each wirebond group comprising three wirebonds, each wirebond group being adjacent to another wirebond group of the plurality of wirebond groups;
   wherein each wirebond group comprises:
   a first wirebond coupling a P-terminal of the opto-electronic device of the wirebond group to the signal processing chip;
   a second wirebond coupling an N-terminal of the opto-electronic device of the wirebond group to the signal processing chip, the second wirebond substantially parallel to the first wirebond and disposed on a first side of the first wirebond; and
   a third wirebond coupling the opto-electronic device chip to the signal processing chip, the third wirebond substantially parallel to the first wirebond and disposed on a second side of the first wirebond opposite the first side, the third wirebond coupling an N-terminal of the opto-electronic device to the signal processing chip.

10. A system for coupling an opto-electronic device chip having a plurality of opto-electronic devices to a signal processing chip, comprising:
    a plurality of wirebond groups, each wirebond group corresponding to one of the opto-electronic devices, each wirebond group comprising three wirebonds, each wirebond group being adjacent to another wirebond group of the plurality of wirebond groups;
    wherein each wirebond group comprises:
    a first wirebond coupling a P-terminal of the opto-electronic device of the wirebond group to the signal processing chip;
    a second wirebond coupling an N-terminal of the opto-electronic device of the wirebond group to the signal processing chip, the second wirebond substantially parallel to the first wirebond and disposed on a first side of the first wirebond; and
    a third wirebond coupling the opto-electronic device chip to the signal processing chip, the third wirebond substantially parallel to the first wirebond and disposed on a second side of the first wirebond opposite the first side, the third wirebond coupling a fixed potential terminal of the opto-electronic device chip to the signal processing chip.

11. A system for coupling an opto-electronic device chip having a plurality of opto-electronic devices to a signal processing chip, comprising:
    a plurality of wirebond groups, each wirebond group corresponding to one of the opto-electronic devices, each wirebond group comprising three wirebonds, each wirebond group being adjacent to another wirebond group of the plurality of wirebond groups;
    wherein each wirebond group comprises:
    a first wirebond coupling a P-terminal of the opto-electronic device of the wirebond group to the signal processing chip;
    a second wirebond coupling an N-terminal of the opto-electronic device of the wirebond group to the signal processing chip, the second wirebond substantially parallel to the first wirebond and disposed on a first side of the first wirebond; and
    a third wirebond coupling the opto-electronic device chip to the signal processing chip, the third wirebond substantially parallel to the first wirebond and disposed on a second side of the first wirebond opposite the first side, wherein the second and third wirebonds couple an N-terminal of the opto-electronic device to a filtered power supply of the signal processing chip.

12. A system for coupling an opto-electronic detector chip having a plurality of opto-electronic detectors to a signal processing chip, comprising:
    a plurality of wirebond groups, each wirebond group corresponding to one of the opto-electronic detectors, each wirebond group comprising three wirebonds, each wirebond group being adjacent to another wirebond group of the plurality of wirebond groups;
    wherein each wirebond group comprises:
    a first wirebond coupling a P-terminal of the opto-electronic detector of the wirebond group to the signal processing chip, the first wirebond coupling an N-terminal of the opto-electronic detector to an amplifier of the signal processing chip;
    a second wirebond coupling an N-terminal of the opto-electronic detector of the wirebond group to the signal processing chip, the second wirebond substantially parallel to the first wirebond and disposed on a first side of the first wirebond; and
    a third wirebond coupling the opto-electronic detector chip to the signal processing chip, the third wirebond substantially parallel to the first wirebond and disposed on a second side of the first wirebond opposite the first side, wherein the second and third wirebonds couple a P-terminal of the opto-electronic detector to a fixed potential.

13. A system for coupling an opto-electronic device chip having a plurality of opto-electronic devices to a signal processing chip, comprising:
    a plurality of wirebond groups, each wirebond group corresponding to one of the opto-electronic devices, each wirebond group comprising three wirebonds, each wirebond group being adjacent to another wirebond group of the plurality of wirebond groups;
    wherein each wirebond group comprises:
    a first wirebond coupling a P-terminal of the opto-electronic device of the wirebond group to the signal processing chip;
    a second wirebond crossing the first wirebond and coupling an N-terminal of the opto-electronic device of the wirebond group to the signal processing chip; and
    a third wirebond crossing both the first wirebond and the second wirebond and coupling the opto-electronic device chip to the signal processing chip.

14. The system claimed in claim 13, wherein each opto-electronic device is an opto-electronic detector comprising a PIN diode.

15. The system claimed in claim 13, wherein each opto-electronic device is an opto-electronic detector, and the first wirebond couples the P-terminal of the opto-electronic detector to an amplifier of the signal processing chip.

16. The system claimed in claim 13, wherein the second and third wirebonds couple the N-terminal of the opto-electronic device to a filtered power supply of the signal processing chip.

17. The system claimed in claim 13, wherein:

each opto-electronic device is an opto-electronic detector;

the first wirebond couples an N-terminal of the opto-electronic detector to an amplifier of the signal processing chip; and the second and third wirebonds couple a P-terminal of the opto-electronic detector to a fixed potential.

* * * * *